(12) United States Patent  
Silvennoinen et al.

(10) Patent No.: US 8,134,832 B2
(45) Date of Patent: Mar. 13, 2012

(54) ELECTRIC DRIVE

(75) Inventors: Mika Silvennoinen, Espoo (FI); Mika Vartiainen, Espoo (FI)

(73) Assignee: ABB Oy, Helsinki (FI)

( * ) Notice: Subject to any disclaimer, the term of this patent is extended or adjusted under 35 U.S.C. 154(b) by 137 days.

(21) Appl. No.: 12/761,546

(22) Filed: Apr. 16, 2010

(65) Prior Publication Data
US 2010/0265659 A1 Oct. 21, 2010

(30) Foreign Application Priority Data

Apr. 21, 2009 (FI) .................................. 20095436

(51) Int. Cl.
*H05K 7/20* (2006.01)
(52) U.S. Cl. ... 361/695; 361/699; 361/700; 165/104.26; 165/104.33; 174/15.1; 174/15.2; 174/16.1
(58) Field of Classification Search .................... None
See application file for complete search history.

(56) References Cited

U.S. PATENT DOCUMENTS

| | | | |
|---|---|---|---|
| 5,485,350 A | 1/1996 | Hecht et al. | |
| 6,536,510 B2 * | 3/2003 | Khrustalev et al. | 165/104.33 |
| 6,628,520 B2 * | 9/2003 | Patel et al. | 361/696 |
| 6,828,675 B2 * | 12/2004 | Memory et al. | 257/714 |
| 7,187,549 B2 * | 3/2007 | Teneketges et al. | 361/699 |
| 7,639,499 B1 * | 12/2009 | Campbell et al. | 361/699 |
| 7,791,884 B2 * | 9/2010 | Huang et al. | 361/700 |
| 2003/0057546 A1 | 3/2003 | Memory et al. | |
| 2005/0264995 A1 * | 12/2005 | Hanson | 361/695 |
| 2010/0202109 A1 | 8/2010 | Zheng et al. | |

FOREIGN PATENT DOCUMENTS

| | | |
|---|---|---|
| CN | 101202528 A | 6/2008 |
| DE | 20 2004 015 168 U1 | 12/2004 |
| EP | 1 298 975 A2 | 4/2003 |
| EP | 1 863 156 A1 | 12/2007 |

OTHER PUBLICATIONS

Finnish Search Report for Finnish Application No. 20095436, dated Jan. 21, 2010 (in the Finnish language).
Chinese Office Action, dated Nov. 23, 2011, issued in Chinese Application No. 201010152037.8.
English Translation of Chinese Office Action, dated Nov. 23, 2011, issued in Chinese Application No. 201010152037.8.

* cited by examiner

*Primary Examiner* — Boris Chervinsky
(74) *Attorney, Agent, or Firm* — Buchanan Ingersoll & Rooney PC

(57) ABSTRACT

An electric drive is disclosed which includes at least a choke unit, a power step unit, and a capacitor unit for implementing power supply to an electricity-consuming device. A cooling arrangement is disclosed for cooling the choke unit, the power step unit, and the capacitor unit. The choke unit, the power step unit, and the capacitor unit can be distributed into at least two separate and separately coolable entities, and the cooling arrangement can include parallel cooling apparatuses for cooling the at least two separate and separately coolable entities.

11 Claims, 4 Drawing Sheets

ELECTRIC DRIVE

RELATED APPLICATIONS

This application claims priority under 35 U.S.C. §119 to Finnish Application No. 20095436 filed in Finland on Apr. 21, 2009, the entire content of which is hereby incorporated by reference in its entirety.

FIELD

An electric drive is disclosed for supplying power to an electricity-consuming device, and for cooling such an electric drive.

BACKGROUND INFORMATION

An electric drive can include components which, when being used, should be cooled to prevent the temperature of the electric drive from rising excessively. Such parts include, for instance, a choke unit, a power step unit, and a capacitor unit.

In a known solution, an electric drive includes a cooling arrangement for cooling a choke unit, a power step unit, and a capacitor unit. In this solution, cooling air is sucked from outside the electric drive to a fan which blows cooling air to a flow channel through the choke unit, the power step unit, and the capacitor unit which are arranged successively in a flow direction.

To provide a cooling flow, a high-powered fan is used because of a significant counterpressure in the flow channel. However, such a high-powered fan is noisy and expensive, and includes a high-powered power feed unit which itself causes losses and costs.

Consequently, sufficient efforts are not made for the cooling arrangement. To the contrary, the amount of power to be drawn from the electric drive is limited to a level at which the heat load generated may be managed by a more inexpensive and less high-powered cooling arrangement.

SUMMARY

An electric drive is disclosed comprising: a choke unit; a power step unit; a capacitor unit for supplying power to an electricity-consuming device; at least two separate, separately coolable entities, with the choke unit, the power step unit, and the capacitor unit being distributed among the at least two separately coolable entities; and a cooling arrangement for cooling the choke unit, the power step unit, and the capacitor unit, the cooling arrangement having parallel cooling apparatuses for cooling the at least two separately coolable entities.

BRIEF DESCRIPTION OF THE DRAWINGS

In the following, exemplary embodiments are described in greater detail by way of example and with reference to the accompanying figures, in which.

DETAILED DESCRIPTION

A solution is disclosed which can enable an inexpensive and efficient cooling arrangement to be implemented in an electric drive so that the existing power of an electric drive may be utilized efficiently. A choke unit, a power step unit, and a capacitor unit to be cooled are distributed into at least two separate and separately coolable entities. Parallel cooling apparatuses of the cooling arrangement enable the entities to be cooled separately. This can result in an electric drive having parallel cooled entities which may be cooled by more low-power cooling apparatuses (e.g., more low-power fans, which enable the cooling to be implemented in an inexpensive manner). Since the entities may be precisely cooled separately to the extent desired, the power of the electric drive may, for example, be utilized in its entirety with no increase in manufacturing costs and with no risk of overheating.

Figure 1:
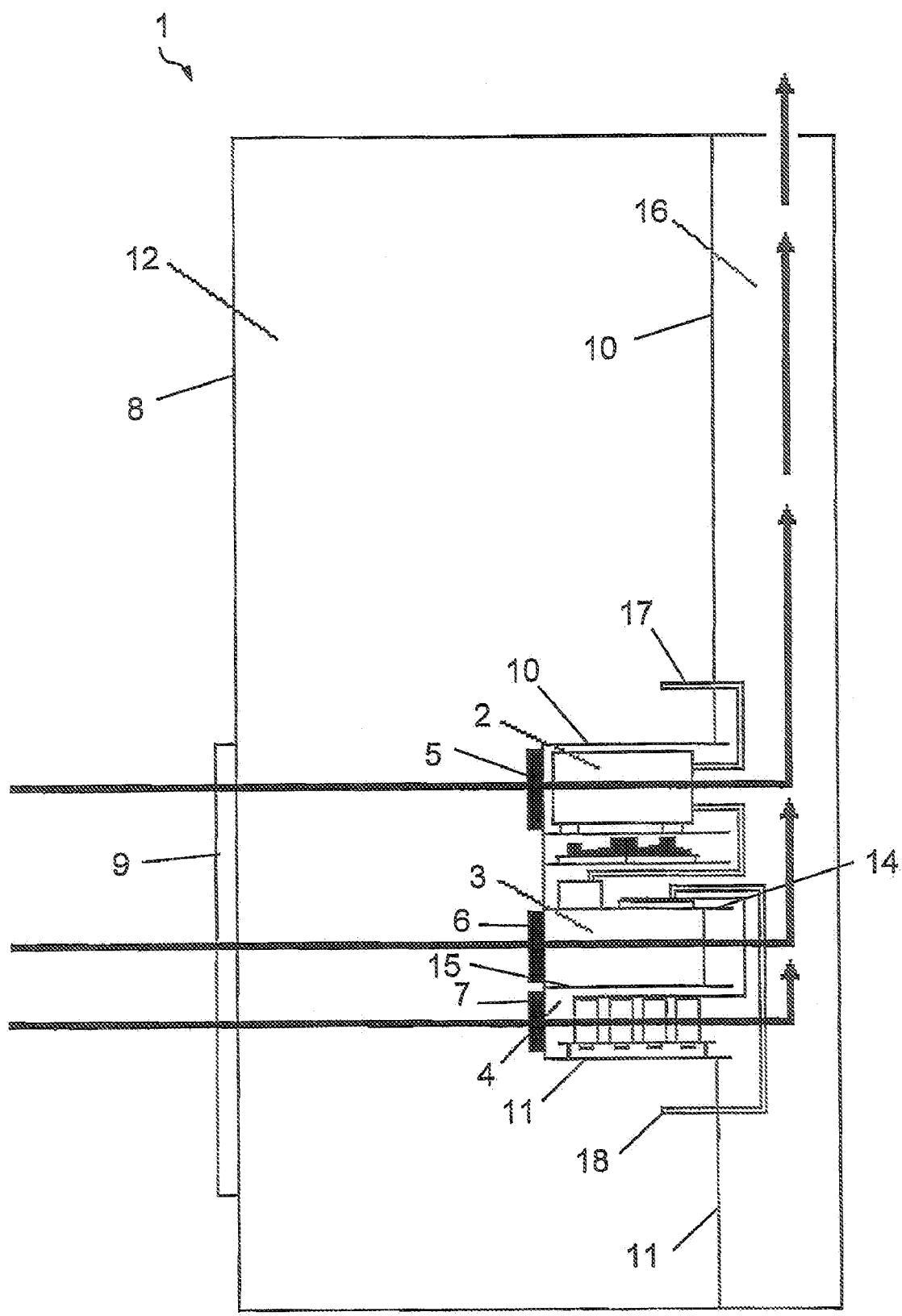
FIG. 1 shows a first exemplary embodiment of an electric drive.

FIG. 1 shows a first exemplary embodiment of an electric drive 1. The electric drive 1 can serve to supply power to an electricity-consuming device. Such a device may be, for example, a frequency converter which, by means of electric power available from an electrical power network, implements a supply of power to an electric motor such that the rotation speed and rotation direction of the electric motor are controlled (e.g., continuously controlled) as desired. For this purpose, the exemplary electric drive 1 set forth in FIG. 1 includes, for instance, a choke unit 2, a power step unit 3, and a capacitor unit 4.

In the FIG. 1 embodiment, the choke unit 2, the power step unit 3, and the capacitor unit 4 are distributed such that each one is arranged in a separate and separately coolable entity of its own. In exemplary alternate embodiments, it will suffice that the particular parts are distributed into at least two separate and separately coolable entities. An exemplary cooling arrangement of the electric drive 1 includes parallel cooling apparatuses for cooling the entities to be cooled. In the exemplary embodiment of FIG. 1, the cooling apparatuses include fans 5, 6, and 7, each one being responsible for cooling one entity by generating an air flow into the entity to be cooled.

The electric drive 1 of FIG. 1 is housed inside an installation cabinet 8, and the fans 5, 6, and 7 generate a cooling air flow into the entities to be cooled by sucking air from outside through a door 9 of the installation cabinet 8. The separate and separately coolable entities can be separated from other parts of the electric drive by means of intermediate walls 10 and 11. Thus, a space 12 is provided in the installation cabinet 8 of the electric drive 1, which may be utilized for parts of the electric drive for which no separate cooling is desired.

The separate and separately coolable entities which include the choke unit 2, the power step unit 3, and the capacitor unit 4 can be separated from one another by intermediate walls 14 and 15. The intermediate walls enable the electric drive 1 to be provided with parallel flow channels such that the entity which includes the choke unit 2 resides in a flow channel of its own, the entity which includes the power step unit 3 resides in a flow channel of its own, and the entity which includes the capacitor unit 4 resides in a flow channel of its own. In the example of FIG. 1, the parallel flow channels can use the same discharge channel 16 for conveying the cooling air flow away therefrom. Regardless of the common discharge channel 16, the intermediate walls 14 and 15 prevent warm air from moving freely from one entity to another, and will suffice for each entity to include a cooling apparatus whose capacity suffices to cool that given entity.

In the exemplary embodiment of FIG. 1, inlet connectors 17 and output connectors 18, through which the electric drive is coupled to the electrical power network and, correspondingly, to the electricity-consuming device to which the power supply is implemented by the electric drive, can be arranged such that they reside at least partly in one or more entities to be cooled. In the example of FIG. 1, the inlet connectors 17 reside partly in the same entity as the choke unit 2, while the output connectors 18 reside partly in the same entity as the capacitor unit 4. However, in order to facilitate the electrical connections, the inlet connectors 17 and, correspondingly, the output connectors 18 can be shaped such that their ends, through which an electrical connection to the electrical power network and, correspondingly, to the electricity-consuming device is carried out, penetrate through the intermediate walls 10 and 11 into the space 12, wherein the electrical connection may be implemented by means of cables, for instance.

In the exemplary embodiment disclosed herein, it is expressly the choke unit, the power step unit, and the capacitor unit that receive special attention when implementing a cooling solution. This, however, is only an example. In practice, the electric drive can also include other devices, such as brake choppers, which can benefit from efficient cooling and for which it is thus appropriate to arrange parallel cooling of their own. It is also feasible that the same electric drive employs more than one corresponding module (e.g., two capacitor units having parallel cooling of their own).

Figure 2:
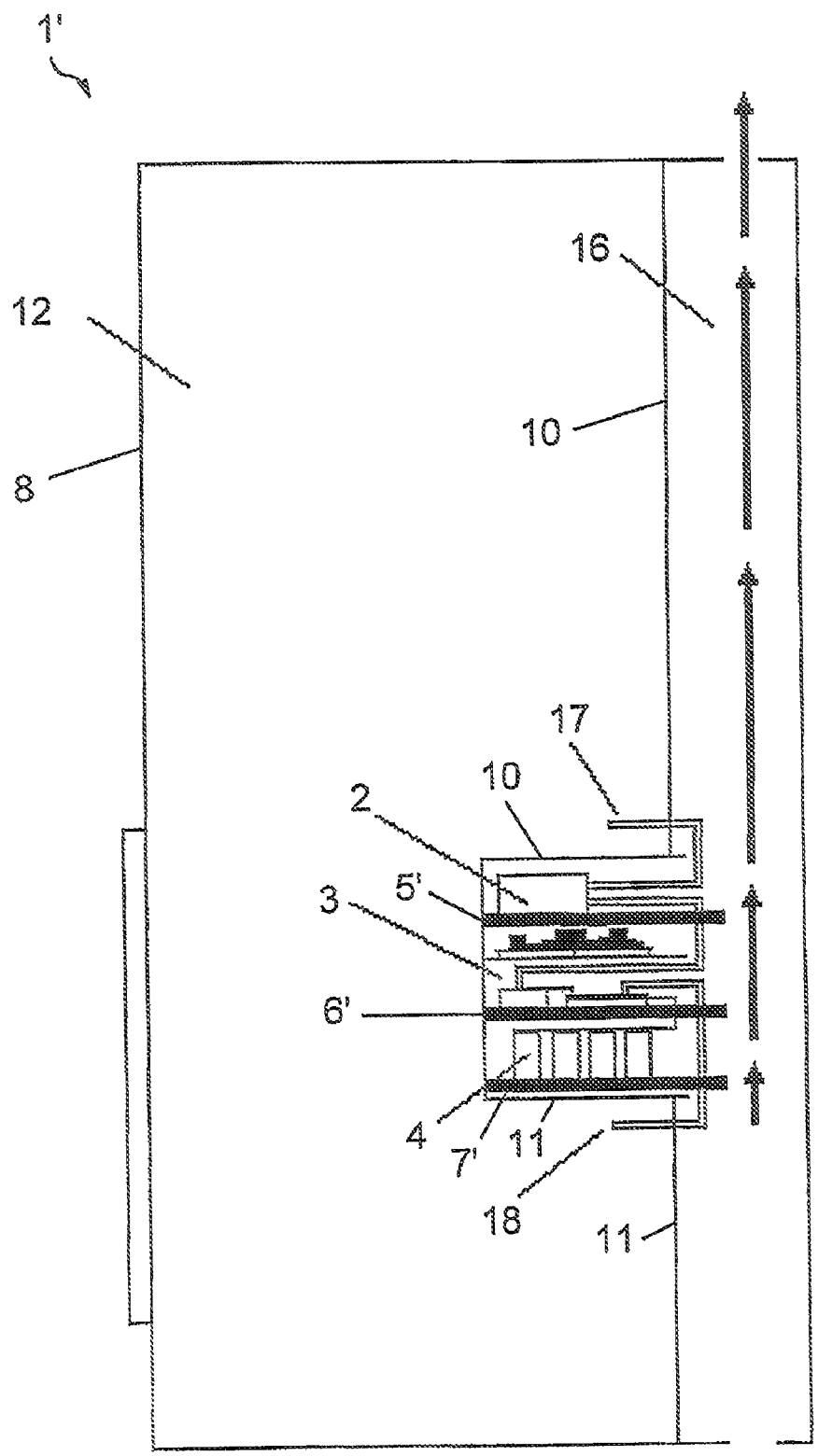
FIG. 2 shows a second exemplary embodiment of an electric drive.

FIG. 2 shows a second exemplary embodiment of an electric drive 1'. The embodiment of FIG. 2 is very similar to the embodiment of FIG. 1 so, in the following, the embodiment of FIG. 2 will be described mainly by drawing attention to differences between these embodiments.

As distinct from FIG. 1, in the example of FIG. 2, the separate and separately coolable entities are not cooled by generating an air flow through the entities. Rather, in the exemplary embodiment of FIG. 2, thermosyphon elements 5', 6' and 7' (e.g., a so-called heat-pipe element) are provided to penetrate into each entity. A thermosyphon element per se is a known heat exchanger which, in the example of FIG. 2, is utilized for transferring heat away from the entity including the choke unit 2, the entity including the power step unit 3, and the entity including the capacitor unit 4. In order to implement this, first ends of the thermosyphon elements 5', 6' and 7' are correspondingly arranged to penetrate into the entity to be cooled, while their second ends are arranged in the discharge channel 16 through which a cooling air flow has been generated. The heat load generated at the first ends of the thermosyphon elements may thus be removed into the air flow through the second ends.

In a manner similar to that disclosed in the embodiment of FIG. 1, intermediate walls may be arranged between the different entities in order to prevent a heat load from transferring from one entity to another.

Figure 3:
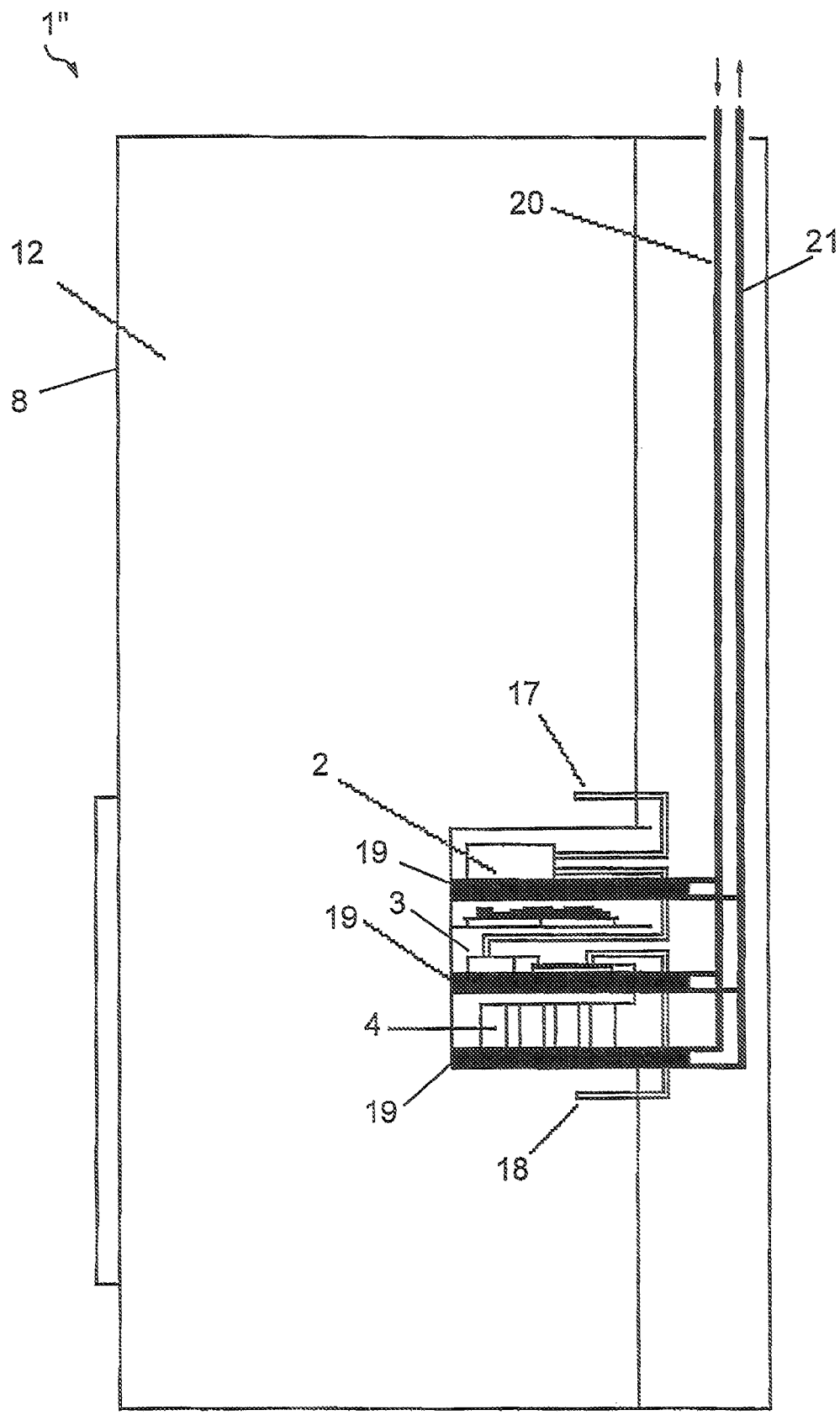
FIG. 3 shows a third exemplary embodiment of an electric drive.

FIG. 3 shows a third exemplary embodiment of an electric drive. The embodiment of FIG. 3 is similar to that of FIG. 1 such that the embodiment of FIG. 3 will be described mainly by drawing attention to differences between these embodiments.

As distinct from FIG. 1, in the case of FIG. 3, the separate and separately coolable entities are not cooled by generating an air flow through the entities. Rather, in the exemplary embodiment of FIG. 3, a cooling element 19 is provided to penetrate into each entity, the cooling element 19 being connected with an inlet pipe 20 and with an outlet pipe 21 in order to generate a cooling fluid flow through a cooling channel of the cooling element. By shaping and dimensioning each of the cooling elements 19 in an individualized manner, the choke unit 2, the power step unit 3, and the capacitor unit 4 may be provided with precisely as efficient cooling as desired.

In a manner similar to the embodiment of FIG. 1, intermediate walls may be arranged between the different entities in order to prevent a heat load from transferring from one entity to another.

Figure 4:
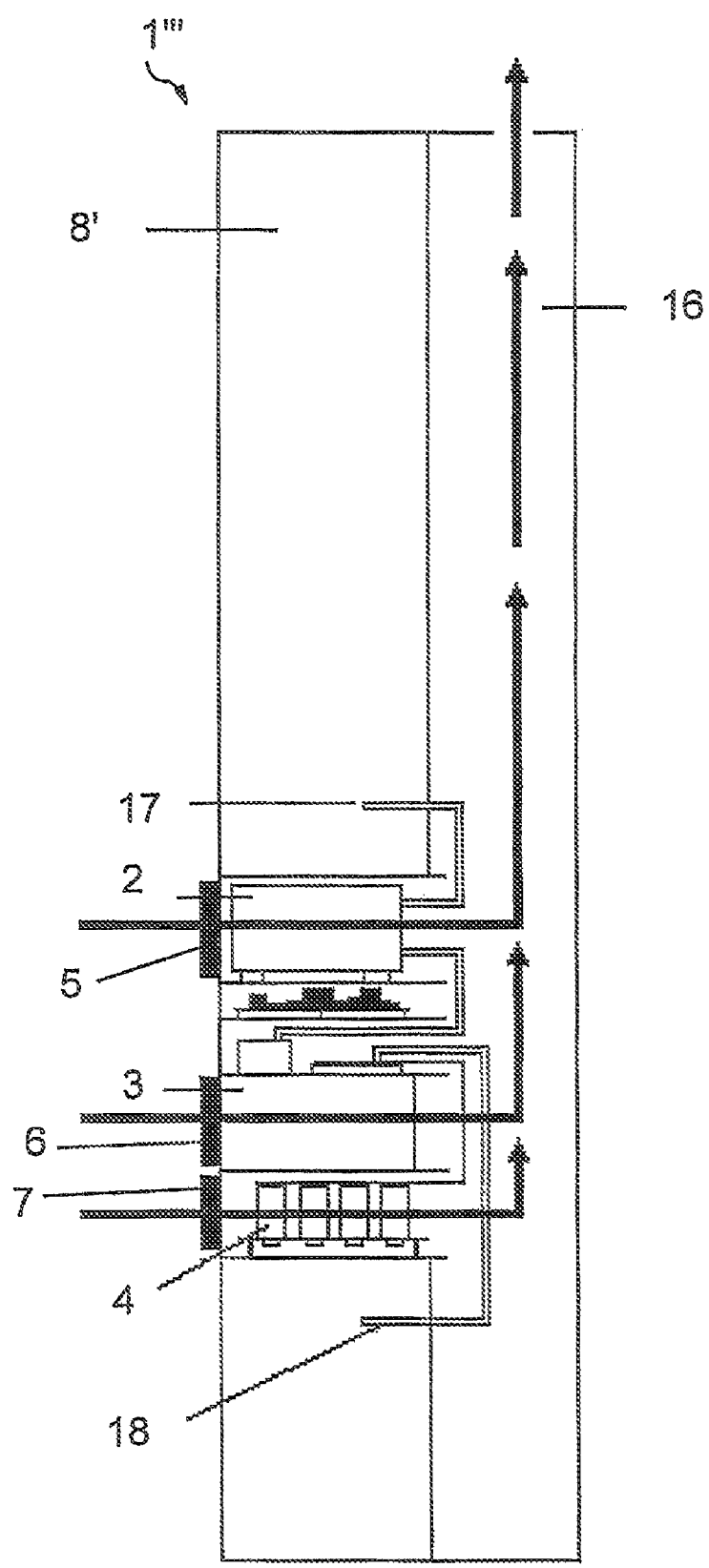
FIG. 4 shows a fourth exemplary embodiment of an electric drive.

FIG. 4 shows a fourth exemplary embodiment of an electric drive. The embodiment of FIG. 4 is similar to that of FIG. 1, but in the example of FIG. 4, the depth of a cabinet 8' is smaller than in the example of FIG. 1. Consequently, the structure of the exemplary FIG. 4 electric drive 1''' differs from the embodiment of FIG. 1 in that the fans 5, 6, and 7 are arranged within the door of the FIG. 1 cabinet, and in the FIG. 4 example they are arranged outside the door. This makes it possible to achieve an electric drive 1''' which, in a depth direction of the cabinet, may be implemented in a space-saving manner.

It has been shown above by way of example that separately coolable entities of the electric drive can be implemented such that they employ the same cooling solution (e.g., an air flow, a thermosyphon element or a cooling element). This, however, is only an example. In practice if, for instance, the desired cooling is to be varied in different entities, different cooling apparatuses may be mutually utilized in the different entities of the same electric drive (e.g., such that a first one is cooled by an air flow, a second one by a thermosyphon element, and a third one by a cooling element having a liquid cooling circulation).

Thus, it will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

What is claimed is:

1. An electric drive comprising:
   a choke unit;
   a power step unit;
   a capacitor unit for supplying power to an electricity-consuming device;
   at least two separate, separately coolable entities, with the choke unit, the power step unit, and the capacitor unit being distributed among the at least two separately coolable entities; and
   a cooling arrangement for cooling the choke unit, the power step unit, and the capacitor unit, the cooling arrangement having parallel cooling apparatuses for cooling the at least two separately coolable entities.

2. An electric drive as claimed in claim 1, wherein the choke unit, the power step unit, and the capacitor unit are distributed such that each constitutes a separately coolable entity, the cooling arrangement comprising:
   parallel cooling apparatuses for each separately coolable entity.

3. An electric drive as claimed in claim 1, comprising:
   intermediate walls for separating the separately coolable entities from other parts of the electric drive.

4. An electric drive as claimed in claim 1, comprising:
   intermediate walls for separating the choke unit, the power step unit, and the capacitor unit into separately coolable entities, the separating walls forming a part of parallel flow channels of the cooling arrangement for generating a separate air flow for each entity to be cooled.

5. An electric drive as claimed in claim 4, comprising:
   a separate fan for each separately coolable entity.

6. An electric drive as claimed in claim 4, wherein the cooling arrangement comprises:
   a common discharge channel for discharging an air flow generated in the coolable entities.

7. An electric drive as claimed in claim 1, wherein the cooling arrangement comprises:
for at least one coolable entity, a thermosyphon element having a first end arranged to penetrate into the at least one coolable entity, and having a second end arranged, separate from the at least one coolable entity, in an air flow to convey a heat load from the coolable entity to the air flow.

8. An electric drive as claimed in claim 1, wherein the cooling arrangement comprises:
for at least one coolable entity, a cooling element arranged in the at least one coolable entity and connected with an inlet pipe and an outlet pipe to provide a cooling fluid flow through a cooling channel of the cooling element.

9. An electric drive as claimed in claim 1, comprising:
inlet connectors and outlet connectors arranged at least partly in the coolable entities.

10. An electric drive as claimed in claim 1, comprising:
an installation cabinet for housing the electric drive.

11. An electric drive as claimed in claim 1, in combination with an electricity-consuming device, wherein the electric drive supplies power to the electricity-consuming device.

* * * * *